(12) United States Patent
Lee et al.

(10) Patent No.: US 6,919,276 B2
(45) Date of Patent: Jul. 19, 2005

(54) METHOD TO REDUCE DISHING AND EROSION IN A CMP PROCESS

(75) Inventors: Shen-Nan Lee, Judung Jen (TW);
Ying-Ho Chen, Taipei (TW);
Syun-Ming Jang, Hsin-Chu (TW);
Tzu-Jen Chou, Hsinchu (TW);
Jin-Yiing Song, Hsinchu (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 73 days.

(21) Appl. No.: 10/423,436

(22) Filed: Apr. 24, 2003

(65) Prior Publication Data

US 2004/0214442 A1 Oct. 28, 2004

(51) Int. Cl.[7] .............................................. H01L 21/302
(52) U.S. Cl. ........................................ 438/692; 438/754
(58) Field of Search ................................ 438/691–692, 438/754

(56) References Cited

U.S. PATENT DOCUMENTS 6,780,773 B2 * 8/2004 Li et al. ...................... 438/691
6,783,432 B2 * 8/2004 Li et al. ...................... 451/36

OTHER PUBLICATIONS

Stanley Wolf Silicon Processing for the VSLI Era vol. 4 lattice Press 2002 pp. 738–739.*

* cited by examiner

Primary Examiner—David S. Blum
(74) Attorney, Agent, or Firm—Tung & Associates

(57) ABSTRACT

A CMP process for selectively polishing an overlying material layer with an underlying layer comprising at least one material in a semiconductor device fabrication process including providing a semiconductor wafer process surface including a first material layer overlying a second layer including one material; mixing at least two slurry mixtures including a first CMP slurry formulation optimized for removing the first material layer and a second CMP slurry formulation optimized for removing the at least a second layer to form a slurry formulation mixture; and, carrying out a CMP process using the slurry formulation mixture to remove the first material layer and at least a portion of the at least a second layer.

23 Claims, 2 Drawing Sheets

METHOD TO REDUCE DISHING AND EROSION IN A CMP PROCESS

FIELD OF THE INVENTION

This invention generally relates to CMP polishing methods and more particularly to a method for polishing an oxide layer adjacent to copper filled semiconductor features included in semiconductor wafer process surface to reduce copper feature dishing and oxide erosion.

BACKGROUND OF THE INVENTION

Planarization is increasingly important in semiconductor manufacturing techniques. As device sizes decrease, the importance of achieving high resolution features through photolithographic processes correspondingly increases thereby placing more severe constraints on the degree of planarity required of a semiconductor wafer processing surface. Excessive degrees of surface non-planarity will undesirably affect the quality of several semiconductor manufacturing process including, for example, photolithographic patterning processes, where the positioning the image plane of the process surface within an increasingly limited depth of focus window is required to achieve high resolution semiconductor feature patterns.

In the formation of conductive interconnections, copper is increasingly used for forming metal interconnects such as vias and trench lines since copper has low resistivity and good electromigration resistance compared to other traditional interconnect metals such as aluminum. The undesirable contribution to electrical parasitic effects by metal interconnect residual resistivity has become increasingly important as device sizes have decreased. One problem with the use of copper relates to it relatively high degree of softness making it subject to relatively high differential material removal rates compared to adjacent dielectric insulating oxide materials during planarization processes such as chemical mechanical polishing (CMP).

Copper chemical mechanical planarization (CMP) is an important aspect of successful electrochemical deposition (ECD) processes where copper and copper barrier layers deposited overlying copper filled features are subsequently removed by a CMP planarization process. Both local and global planarization is critical to successful device operation especially with respect to forming overlying integrated device features. A recurring problem in copper CMP processes is that the simultaneous goal of achieving fast material removal rates of the copper and the underlying barrier layer without erosion of the underlying insulating dielectric layer or dishing of the copper filled feature is difficult to attain. Typically, the excess copper layer is removed following ECD according to a CMP process which generally includes an abrasive polishing slurry and a polishing pad applied with a significant down force to the semiconductor wafer surface. Typically multiple CMP polishing steps are used to first remove the copper layer followed by removal of the barrier layer to reveal an oxide layer and typically including a final oxide layer buffing step. In the prior art separate slurries are used for the individual CMP polishing steps to achieve the desired selectivity and removal rates. For example, it is frequently desirable to first use a slurry with a high copper removal rate to minimize the required polishing time for relatively thick overlayers of excess copper. The high removal rate slurry is then replaced with a low or medium removal rate slurry and polishing system including a different polishing pad to remove the barrier layer at a slower rate to reduce erosion of the underlying oxide layer and to reduce copper dishing.

The planarity of CMP processes is increasingly critical especially for devices having narrow semiconductor features such as line widths below about 0.25 micron. CMP planarization is typically used several different times in the manufacture of a multi-level semiconductor device, including planarizing levels of a device containing both dielectric and metal portions to achieve local and global planarization for subsequent processing of overlying levels. Several semiconductor wafer defects are associated with non-planarities introduced during CMP polishing. For example, in CMP polishing of high polish rate materials such as copper features adjacent to an oxide surface, uniform polishing or local planarization is highly dependent on feature density. For example, the material removal rate is proportionally faster over larger surface areas of high polish rate material leading to dishing. In addition, a high pattern density (small pitch) of metal filled features adjacent to lower polish rate materials such as nitrides or oxides can lead to both dishing and erosion over the patterned area. Generally, erosion is defined as the thinning of the oxide layer thickness, for example, a low-k (low dielectric constant) oxide material including metal filled features, relative to an unpatterned or lower pattern density area. Dishing is defined as the reduced thickness of the metal feature from the lowest point of the feature relative to the adjacent oxide layer. Therefore the sum of the erosion and dishing represents total metal removal. Although erosion of narrow copper features in a relatively densely patterned area of a wafer process surface is known and various approaches have been proposed to reduce erosion, dishing of the relatively narrow line width copper features remains a problem which can degrade device electrical reliability and performance. One approach to improving planarity and reducing erosion has been to use slurries having higher selectivity's for material removal of the target layer with respect to an underlying layer.

For example, highly selective polishing slurries for polishing the various layers are available commercially and formulated for polishing the particular targeted polishing layer, for example a copper layer overlying an adhesion/barrier layer and a tantalum nitride (e.g., TaN) barrier layer overlying an oxide layer, for example an insulating dielectric layer or an oxide capping layer. High selectivity slurries may include various metal oxide abrasives including for example, silica ($SiO_2$), alumina ($Al_2O_3$), ceria ($CeO_2$), titania ($TiO_2$), manganese dioxide ($MnO_2$), and zirconia ($ZrO_2$). In addition, complexing agents and surfactants are typically used to facilitate interaction of the slurry abrasive with the targeted polishing surface.

The increased use of lower strength low-k materials for the insulating dielectric layer, also referred to as an interlayer dielectric (ILD) layer or inter-metal dielectric (IMD) layer, has led to increased vulnerability of oxide erosion resulting in surface topography variations caused by slurries having less than adequate selectivity with respect to an underlying layer, for example a TaN adhesion/barrier layer overlying an oxide based layer, for example an ILD layer, an anti-reflectance coating (ARC) layer, or an oxide capping layer. As pointed out, one approach in the prior art to reduce erosion of an underlying oxide layer has been to use slurries with a higher selectivity with respect to the underlying layer, for example in polishing a barrier layer overlying an oxide layer. One problem with this approach is that the high selectivity slurries formulated for polishing the particular layers frequently also have copper removal rates resulting in dishing of relatively narrow copper features leading to subsequent processing difficulties and device electrical performance degradation. Generally, both erosion and dishing lead to several subsequent processing difficulties such as forming overlying layer features with adequate integrated electrical connectivity, as well as optical resolution issues in photolithographic patterning steps. As such, it has been difficult to develop CMP polishing methods that can accomplish both requirements of reduced oxide layer erosion and copper feature dishing.

Therefore, there is a need in the semiconductor art for an improved CMP polishing method whereby a CMP polishing step including a CMP polishing slurry is better optimized for polishing copper filled features adjacent to an oxide surface to avoid the problems of dishing of the copper filled features while avoiding oxide erosion.

It is therefore an object of the invention to provide an improved CMP polishing method whereby a CMP polishing step including a CMP polishing slurry is better optimized for polishing copper filled features adjacent to an oxide surface to avoid the problems of dishing of the copper filled features while avoiding oxide erosion in addition to overcoming other shortcomings and deficiencies in the prior art.

SUMMARY OF THE INVENTION

To achieve the foregoing and other objects, and in accordance with the purposes of the present invention, as embodied and broadly described herein, the present invention provides a CMP process for selectively polishing an overlying material layer with respect to an underlying layer comprising at least one material in a semiconductor device fabrication process.

In a first embodiment, the method includes providing a semiconductor wafer process surface including a first material layer overlying at least a second layer including at least one material; mixing at least two slurry mixtures including a first CMP slurry formulation optimized for removing the first material layer and a second CMP slurry formulation optimized for removing the at least a second layer to form a slurry formulation mixture; and, carrying out a CMP process using the slurry formulation mixture to remove the first material layer and at least a portion of the at least a second layer.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Figure 1A:
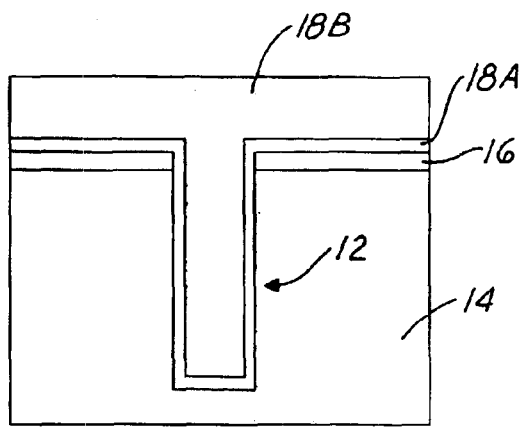
FIGS. 1A–1E are cross sectional side view portions of a semiconductor feature included in a process wafer at stages of manufacture according to an embodiment of the present invention.

Although the CMP process according to the present invention is explained with reference to copper semiconductor features formed in a low-k dielectric material layer associated with a multilayer semiconductor device, it will be appreciated that the CMP process may be advantageously used in a CMP process to polish copper semiconductor features having adjacent oxide containing material surfaces having relatively higher dielectric constant material layers. In addition, although the method of the present invention is explained with reference to narrow copper filled semiconductor features, for example a copper filed damascene having a line width of less than about 0.25 microns, it will be appreciated that the CMP process may advantageously be used for polishing any copper filled semiconductor feature where it would be advantageous to reduce dishing of the copper feature during the CMP process including polishing an a oxide containing material surface adjacent a damascene feature such as vias and dual damascene features. In addition, while the CMP process of the present invention is advantageously used to polish a copper filled damascene feature it will be appreciated that the CMP process may advantageously be used with other metal filled (damascene) features to achieve the goals of reducing dishing in relatively narrow line width metal filled semiconductor features. As used herein, the term "copper" means copper and alloys thereof. The term "low-k" means having a dielectric constant of less than about 3.2.

In a first embodiment of the invention a first material layer is provided forming a semiconductor wafer process surface overlying at least a second material layer. A first CMP slurry formulation optimized for removing the first material layer is then mixed with a second CMP slurry formulation optimized for removing the at least a second material layer to form a slurry formulation mixture. A CMP process using the slurry formulation mixture is then carried out to remove the first material layer and the at least a second material layer. In one embodiment, the first and second CMP slurry formulations are optimized by having a relatively higher material removal rate of the first material layer compared to a material removal rate of the at least a second material removal rate.

In another embodiment, the at least a second material layer includes a metal filled feature adjacent to an oxide containing surface which is a third material layer (e.g., second material in second layer, for example metal filled damascene). The second CMP slurry formulation is optimized by having a third material layer removal rate that is relatively greater compared to the second material layer removal rate.

In one embodiment, the slurry formulation mixture is formed by mixing a volumetric ratio of the first CMP slurry formulation with respect to the second CMP slurry formulation from about 1:10 to about 10:1, more preferably about 1:2 to about 2:1 with respect to the total volume of the slurry formulation mixture.

In another embodiment, the slurry formulation mixture exhibits an increased removal rate of the first material layer removal rate with respect to at least one of the second and third material layer removal rates.

Referring to FIG. 1A, in an exemplary implementation of the present invention an array of metal filled interconnect features, for example trench lines e.g., 12, having a line width of less than about 0.25 microns are formed in a dielectric insulating layer 14 by a conventional anisotropic etching and photolithographic patterning process. For example, the dielectric insulating layer 14 is a silicon dioxide based material, for example a carbon doped silicon dioxide, also referred to as organo silicate glass (OSG) and C-oxide. Several commercially available formulations are available for producing the low-k carbon doped oxide, for example, known as SILK™ and BLACK DIAMOND™. In addition, the carbon doped oxides may be produced by plasma enhanced CVD methods using organo-silane precursors such as octa-methyl-cyclo-tetra-siloxane and tetra-methyl-cyclo-tetra-siloxane where the dielectric constant may be varied over a range depending on the precursors and process conditions. C-oxide, for example, may be formed with dielectric constants over a range of about 2.0 to about 3.0 having a density of about 1.3 g/cm$^3$. Other types of low-k materials suitably used with the method of the present invention as dielectric insulating layers, also referred to as inter-layer dielectric (ILD) layers, include fluorinated silicate glass (FSG) and porous oxides.

It will be appreciated that organic ILD layers may be advantageously used in the method of the present invention where an oxide based capping layer or anti-reflectance coating (ARC) is provided over the ILD layer. Exemplary organic low-k materials include polyarylene ether, hydrogen silsesquioxane (HSQ), methyl silsesquioxane (MSQ), polysilsesquioxane, polyimide, benzocyclobutene, and amorphous Teflon.

Still referring to FIG. 1A, overlying the ILD layer 14 is formed an oxide based layer 16, for example including at least one of an SiO$_2$ capping layer to protect the underlying ILD layer, an oxide etching stop layer, for example silicon oxynitride (e.g., SiON), and an ARC layer, for example silicon oxynitride (e.g., SiON), to reduce standing wave reflections in a subsequent photolithographic patterning process. For example, the oxide layer 16 (e.g., ARC layer) is from about 500 Angstroms to about 1500 Angstroms in thickness.

Still referring to FIG. 1A, a barrier layer 18A formed of, for example, a refractory metal including at least one of tantalum, titanium, and tungsten, and nitrides thereof including multiple layers such as a metal/metal nitride layer, is blanket deposited to line the etched trench features 12 at a thickness of about 50 Angstroms to about 150 Angstroms. The barrier layer 18A serves the purpose of preventing subsequently deposited copper from diffusing into the surrounding ILD layer 14 and improves adhesion of the copper.

Still referring to FIG. 1A, following deposition of barrier layer e.g., 18A, a copper layer 18B is electroplated according to a conventional electrochemical deposition (ECD) process to fill the trench line features, 12 including an overlayer above the trench level of about 400 Angstroms to about 6000 Angstroms. It will be appreciated that other metals including tungsten, aluminum and aluminum copper alloys may suitably be used with the method of the present invention but is most advantageously used with a copper. Prior to electrodeposition, a seed layer of copper (not shown) is deposited over the barrier layer 18A by, for example by PVD or CVD. The copper seed layer is preferably deposited to form a continuous layer thereby providing a continuously conductive surface for the bulk copper ECD process.

Figure 1B:
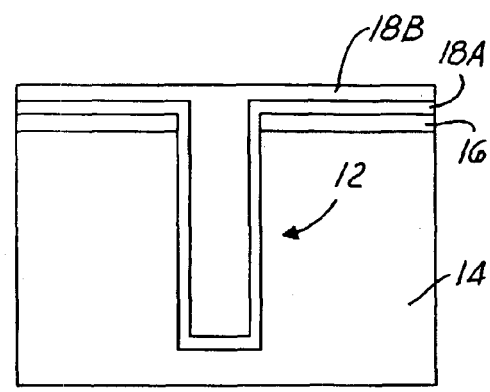

Referring to FIG. 1B, in an exemplary embodiment of the method according to the present invention, a first CMP process is first carried out to remove at least a portion of the excess copper layer 18B overlying the barrier layer 18A for example leaving about 1500 Angstroms to about 2500 Angstroms overlying the barrier layer 18A. The first CMP process preferably uses a slurry and polishing pad optimized for a high removal rate of copper, for example from about 4000 Angstroms/minute to about 8000 Angstroms/minute. In a second CMP process, a slurry is optimized for removal of copper with high selectivity to the underlying barrier layer 18A is used to remove a remaining portion of copper overlying the barrier layer to reveal at least a portion of the barrier layer 18A. For example, the CMP slurry used in the second CMP process has a material removal rate of copper with respect to the barrier layer of from about 10:1 to about 50:1. Several formulations of commercially available polishing slurries having the preferred selectivity are available. For example, the removal rate of copper in the first CMP process is about 4000 Angstroms/minute to about 8000 Angstroms/minute with the second CMP process having a copper removal rate slower by about 20 percent to about 50 percent.

Figure 1C:
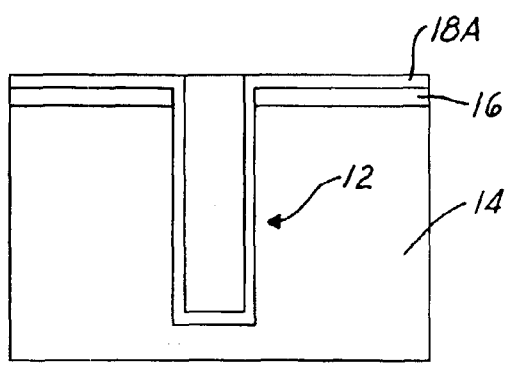

Referring to FIG. 1C, in one embodiment, the second CMP process is carried out to endpoint detection of the barrier layer 18A underlying the copper layer 18B. By the term 'endpoint detection' is meant that point at which a portion of the underlying layer, for example the barrier layer, is revealed in the polishing process sufficient to be detected by an endpoint detecting means. Endpoint detection may be accomplished by any process however, preferably, the endpoint detection process detects a point in the CMP process at which a portion of the wafer polishing surface includes exposure of a portion of the underlying layer, for example the barrier layer 18A, and a portion of the overlying layer, for example the copper layer 18B. For example, preferably, at endpoint detection there will be portions of the semiconductor process surface where the barrier layer is exposed and portions where the copper overlayer remains. Exemplary endpoint detection systems known in the art that may suitably be used include, for example, real-time optical detection methods including wafer polishing surface reflectance measurements, as well as laser interferometry. In addition, methods such as polishing pad motor load monitoring, or monitoring the electrical potential of the polishing effluent may be suitably used for endpoint detection.

Figure 1D:
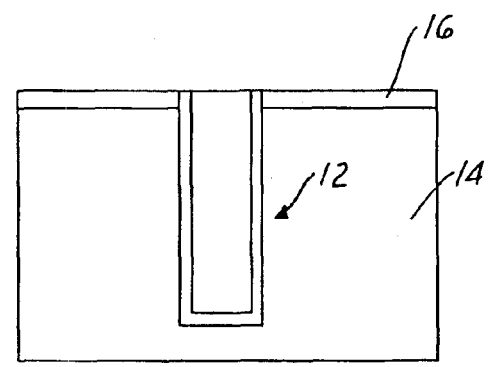

Referring to FIG. 1D, in a third CMP process, a CMP slurry (barrier layer slurry) having a material removal rate of the barrier layer 18A about equal to or greater compared with the underlying oxide layer 16 and a greater material removal rate with respect to the copper filled trench lines e.g., 12A, is used to remove a remaining portion of the remaining copper and a portion of the barrier layer to reveal at least a portion of the underlying oxide surface 16, e.g., an ARC layer. Preferably, the barrier layer slurry has a material removal rate ratio with respect to the material removal rate of the underlying copper layer of about 2:1 to about 12:1.

Figure 1E:
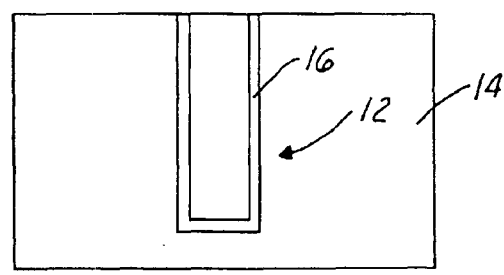

Referring to FIG. 1E, in a fourth CMP process according to an embodiment of the present invention, the CMP process is carried out to remove a remaining portion of the barrier layer 18A and the underlying oxide layer 16 (e.g., ARC layer) to reveal a portion of the underlying ILD layer using a mixture of the barrier layer slurry (third CMP slurry) and an oxide polishing slurry to form a mixed formulation slurry. For example, the oxide polishing slurry preferably has a material removal rate ratio compared to a copper removal rate of about 2:1 to about 10:1. Preferably oxide polishing slurry is formulated such the removal rate of the barrier layer compared to the oxide removal rate is about equal to or less than the oxide material removal rate. In a preferred embodiment, the slurry formulation mixture has a volumetric ratio of the barrier layer polishing slurry to the oxide polishing slurry of about 1:10 to about 10:1, more preferably from about 1:2 to about 2:1. Preferably, the slurry formulation mixture has a material removal rate of the oxide layer (ARC layer) compared to the copper removal rate that is greater than either of the third CMP slurry and oxide polishing slurry (fourth slurry) used alone. Preferably, at least one of the barrier layer slurry (third CMP slurry) and the oxide polishing slurry (fourth CMP slurry) include at least one nitrogen containing chelating agent to form the mixed formulation slurry.

A copper corrosion inhibitor, for example BTA is preferably added to cover the exposed copper features prior to at least carrying out a fifth CMP process for buffing the oxide using a slurry formulation having a material removal rate ratio of oxide compared to a removal rate of copper of at least 2:1 to about 10:1. However, the copper corrosion inhibitor may be optionally added prior to the third or fourth CMP process. Preferably, the copper corrosion inhibitor solution includes at least one of Benzotriazole (BTA), and Benzotriazole derivatives such as Triazole, and Tritriazole. BTA is preferred as it has been found to be the most effective copper corrosion inhibitor. The copper corrosion inhibitor solution preferably includes a mixture of BTA and deionized water including a concentration of BTA from about 0.02 weight percent to about 0.1 weight percent. It will be appreciated that the corrosion inhibitor may be optionally added prior to the fourth CMP process.

Figure 2:
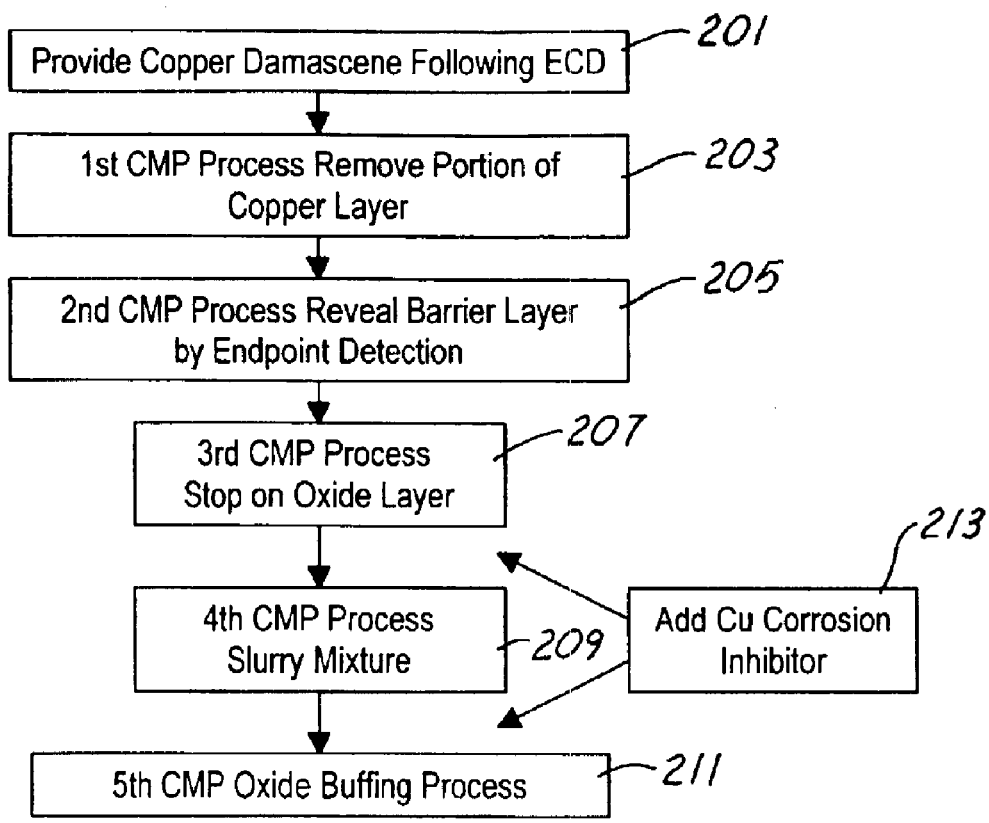
FIG. 2 is a process flow diagram including several embodiments of the present invention.

Referring to FIG. 2 is a process flow diagram including several embodiments of the present invention. In process 201, a semiconductor wafer process surface having a copper filled semiconductor feature with an overlying layer of blanket deposited copper is provided. In process 203 a first CMP process is carried out using a first CMP slurry to remove a portion of the copper overlayer. In process 205, a second CMP process is carried out to endpoint detection of an underlying barrier layer using a second CMP slurry having a copper material removal rate greater than a barrier layer removal rate. In process 207, a third CMP process is carried out to at least partially reveal an underlying oxide layer using a third CMP slurry having a barrier layer removal rate greater than a copper removal rate according to preferred embodiments. In process 209, a fourth CMP process is carried out to remove a remaining portion of the barrier layer and the underlying oxide layer to reveal the underlying ILD layer using a fourth CMP slurry including using a mixture of the third CMP slurry and an oxide polishing slurry according to preferred embodiments. In process 211, an oxide buffing process is carried out using a fifth CMP process for buffing the oxide using a slurry formulation according to preferred embodiments. As indicated by process 213, a copper corrosion inhibitor such as BTA is added to form a passivation layer over the copper filled features prior to at least one of the fourth and fifth CMP processes.

According to the CMP process of one embodiment of the present invention, it has been found that using the mixed formulation slurry in the fourth polishing process produces a synergistic effect to increase a removal rate of the oxide layer compared to a removal rate of copper compared to the oxide polishing slurry alone by greater than about 100 percent, thereby reducing both erosion and dishing to reduce total copper feature removal by about greater than 50 percent. Although the precise reason for the synergistic effect is not presently clear it is believed to be related to the interaction of chelating agents typically used to chelate oxide materials present in the oxide polishing slurry and chelating agents typically used to chelate metal or metal nitride materials present in the barrier layer polishing slurry.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A CMP process for selectively polishing an overlying material layer with respect to an underlying surface comprising at least two materials comprising the steps of:
   providing a semiconductor wafer process surface comprising a first material layer overlying a second material layer and a third material layer penetrating said first and second material layers;
   mixing at least two slurry mixtures to form a slurry formulation mixture comprising a first CMP slurry formulation having a first material removal rate for removing the first material layer and a second CMP slurry formulation having a second material removal rate for removing the second material layer; and,
   carrying out a CMP process using the slurry formulation mixture to remove the first material layer and at least a portion of the second material layer.

2. The method of claim 1, wherein the slurry formulation mixture comprises a relatively lower material removal rate of the respective first material layer and the second material layer compared to the third material layer when compared to either of the first and second CMP slurry formulations.

3. The method of claim 1, wherein the first CMP slurry formulation comprises at least a first chelating agent and the second CMP slurry formulation comprises at least a second chelating agent.

4. The method of claim 1, wherein the third material layer comprises a metal adjacent to the second material layer, the second material layer comprising an oxide.

5. The method of claim 1, wherein the first material layer is a capping layer, an ARC layer, or an ILD layer.

6. The method of claim 4, wherein the third material layer comprises a metal filled damascene structure.

7. The method of claim 4, wherein the first material layer includes at least one of a refractory metal and refractory metal nitride.

8. The method of claim 4, wherein the second CMP slurry formulation comprises a relatively higher metal removal rate for the metal compared to the second material layer removal rate by a ratio of about 1:2 to about 1:12.

9. The method of claim 8, wherein the first CMP slurry formulation comprises a relatively higher metal removal rate for the metal compared to the second material layer removal rate by a ratio of about 1:2 to about 1:10.

10. The CMP process of claim 9, wherein the slurry formulation mixture comprises a relatively lower metal removal rate for the metal compared to the second CMP slurry formulation.

11. The method of claim 1, wherein the slurry formulation mixture has a volumetric ratio of the first CMP slurry formulation with respect to the second CMP slurry formulation from about 1:10 to about 10:1.

12. The method of claim 4, wherein the slurry formulation mixture has a lower metal removal rate for the metal compared to a material removal rate for the second material layer.

13. A method comprising the steps of:
   providing a dielectric layer overlying a substrate;
   forming an ARC layer overlying the dielectric layer;
   patterning the ARC layer and the dielectric layer to form a trench therein;
   forming a barrier layer overlying the ARC layer and lining the trench;
   filling a conductor layer in the trench;
   carrying out a first CMP process comprising a first CNP slurry for removing the conductor layer to reveal a portion of the barrier layer;

carrying out a second CMP process comprising a second CMP slurry to remove at least a portion of the barrier layer to expose the ARC layer; and, carrying out a third CMP process comprising a slurry mixture to remove a remaining portion of the barrier layer to include at least a portion of the ARC layer, said slurry mixture comprising the second CMP slurry and a third CMP slurry comprising an oxide polishing slurry.

14. The method of claim 13, wherein the slurry mixture has an increased ARC layer removal rate than the third CMP slurry.

15. The method of claim 13, wherein the second CMP slurry has a barrier layer removal rate with respect to the conductor removal rate of about 2 to 1 to about 12 to 1.

16. The method of claim 13, wherein the third CMP slurry has a ratio of the ARC layer removal rate with respect to the conductor removal rate of about 2 to 1 to about 10 to 1.

17. The method of claim 14, wherein the slurry mixture has a ratio of the ARC layer removal rate with respect to the conductor removal rate of about 2 to 1 to about 12 to 1.

18. The method of claim 13, further comprising a fourth CMP polishing step using the third CMP slurry to remove a remaining portion of the ARC layer to expose the dielectric insulating layer.

19. The method of claim 18, further comprising an oxide buffing step following the fourth CMP process.

20. The method of claim 19, wherein a conductor corrosion inhibitor comprising at least one of Benzotriazole (BTA), derivatives thereof, and a nitrogen containing chelating agent comprises a slurry additive in a CMP process selected from the group consisting of the second, third and fourth CMP processes, and the oxide buffing step.

21. The method of claim 13, wherein the second CMP slurry comprises a first chelating agent and the third CMP slurry comprises at least a second chelating agent.

22. A chemical mechanical polish (CMP) process for preventing erosion of copper interconnect features in a semiconductor manufacturing process comprising the steps of:

providing a semiconductor wafer process surface comprising a trench formed in a dielectric insulating layer;

said dielectric insulating layer having an overlying anti-reflectance coating (ARC) layer;

said trench comprising a barrier layer lining the trench and overlying the ARC layer;

said trench further comprising a copper layer filling the trench and overlying the barrier layer;

performing a first CMP process comprising a first CMP slurry solution to remove a first portion of the copper layer such that a remaining thickness portion of the copper layer above the trench level is less than about 2000 Angstroms;

performing a second CMP process comprising a second CMP slurry solution to remove a second portion of the copper layer to expose the barrier layer;

performing a third CMP process comprising a third CMP slurry solution to remove a first thickness portion of the barrier layer to expose the ARC layer;

performing a fourth CMP process comprising a mixture of the third CMP slurry solution and a fourth CMP slurry solution comprising an oxide polishing solution to remove a portion of the ARC layer and a remaining portion of the barrier layer to expose the dielectric insulating layer; and, performing a fifth CMP process comprising said fourth CMP slurry solution for removing a remaining portion of the ARC layer.

23. The method of claim 13, wherein the conductor comprises copper.

* * * * *